United States Patent
Kandel et al.

(10) Patent No.: US 7,602,491 B2
(45) Date of Patent: Oct. 13, 2009

(54) OPTICAL GAIN APPROACH FOR ENHANCEMENT OF OVERLAY AND ALIGNMENT SYSTEMS PERFORMANCE

(75) Inventors: Daniel Kandel, Aseret (IL); Vladimir Levinski, Nazareth-Ilit (IL); Michael Adel, Zirchon Yaakov (IL); Joel Seligson, Misgav (IL)

(73) Assignee: KLA-Tencor Corporation, San Jose, CA (US)

( * ) Notice: Subject to any disclaimer, the term of this patent is extended or adjusted under 35 U.S.C. 154(b) by 0 days.

(21) Appl. No.: 12/108,364

(22) Filed: Apr. 23, 2008

(65) Prior Publication Data

US 2008/0266561 A1   Oct. 30, 2008

Related U.S. Application Data

(60) Provisional application No. 60/914,295, filed on Apr. 26, 2007.

(51) Int. Cl.
*G01B 11/00* (2006.01)
*G01B 11/02* (2006.01)
*G06K 9/00* (2006.01)

(52) U.S. Cl. .................. 356/399; 356/401; 356/508; 382/151

(58) Field of Classification Search .................. None
See application file for complete search history.

(56) References Cited

U.S. PATENT DOCUMENTS

| | | | |
|---|---|---|---|
| 4,170,401 A | * | 10/1979 | Yoder et al. .................. 359/487 |
| 4,386,849 A | | 6/1983 | Haeusler et al. |
| 4,991,963 A | | 2/1991 | Sutton |
| 6,198,574 B1 | * | 3/2001 | Hill .............................. 359/497 |
| 6,781,775 B2 | * | 8/2004 | Bendat et al. ................ 359/834 |
| 6,809,827 B2 | * | 10/2004 | Kreuzer ....................... 356/508 |
| 7,119,886 B2 | * | 10/2006 | Leenders et al. .............. 356/3.1 |
| 2003/0081314 A1 | * | 5/2003 | Destain ....................... 359/485 |
| 2007/0030477 A1 | | 2/2007 | Hwang et al. |

OTHER PUBLICATIONS

U.S. Appl. No. 60/914,295, filed Apr. 26, 2007.
International Search Report and Written Opinion of the International Searchign Authority for the International application No. PCT/US2008/061318 dated Aug. 4, 2008, 9 page.

* cited by examiner

*Primary Examiner*—Michael A Lyons
*Assistant Examiner*—Gordon J Stock, Jr.
(74) *Attorney, Agent, or Firm*—Joshua D. Isenberg; JDI Patent

(57) ABSTRACT

A resultant image of a grating target may be obtained by dividing an image of the target into first and second portions and optically modifying the first and/or second portion such that a final image formed from their combination is characterized by a Moiré pattern. The resultant image may be analyzed to determine a shift in the grating target from a shift in the Moiré pattern. Optical alignment apparatus may include a first beam splitter, an image transformation element optically coupled to the first beam splitter, and a second beam splitter. The first beam splitter divides an image of a grating target into first and second portions. The second beam splitter combines the first portion and the second portion. The image transformation element optically modifies the first and/or second portion such that a final image formed from their combination is characterized by a Moiré pattern.

11 Claims, 4 Drawing Sheets

OPTICAL GAIN APPROACH FOR ENHANCEMENT OF OVERLAY AND ALIGNMENT SYSTEMS PERFORMANCE

CLAIM OF PRIORITY

This application claims the benefit of priority of commonly-assigned U.S. Provisional Patent Application No. 60/914,295 filed Apr. 26, 2007, the entire contents of which are incorporated herein by reference.

FIELD OF THE INVENTION

This invention generally relates to metrology associated with semiconductor wafer processing and more particularly to overlay and alignment systems used in semiconductor wafer processing metrology.

BACKGROUND OF THE INVENTION

Semiconductor device processing involves etching a pattern from a layer of material or depositing a pattern of material over a different layer. Grating-type targets are often used in semiconductor device fabrication to measure errors in alignment and overlay of different layers.

A method for gain creation is based on the Moiré principle, where a grating on grating target is designed with close pitch values of the gratings. When, for example, the designed pitch values are unresolved, the only detectable signal has a very large pitch and results from interference between light scattered by both gratings. The main advantage of this approach is that it reduces many possible contributions to the tool-induced shift (TIS) budget by a gain factor.

There are certain disadvantages associated with the prior art Moiré approach. For example, this approach produces relatively low contrast since the signal is obtained by double scattering. Secondly, the prior art Moiré approach is not applicable to alignment targets since there is only one grating corresponding to the process layer and the prior art approach requires two gratings. Furthermore, the prior art Moiré approach prints one grating on top of another, which is not suitable for measurement of a standard side-by-side grating target.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In embodiments of the present invention the positions of diffraction orders from a grating target are redistributed within a pupil plane of an optical apparatus. As used herein, a pupil plane may be regarded as a plane containing an image of the pupil (e.g., an aperture stop) of a lens or system of lenses. Such a plane may be located between the pupil and the field (the plane of the image). If, e.g., the system contains a tube lens and the field is only a single point, then any plane in a collimated portion of the optical column between the objective and the lens could be a pupil plane. For this purpose a plane conjugate to the pupil plane may be created, e.g., with relay optics and an interferometer may be used to split the light from the pupil plane into two images and to recombine these images such that light from the two images interferes. There are two main possibilities for creating optical gain. Both of them involve splitting the light (with a beam splitter for example) scattered from a grating into two waves, performing certain geometrical operations on these waves and combining them back to generate (by interference) a single wave which has the gain property.

According to embodiments of the present invention, a substrate may be aligned using a single grating target. Two or more final images of the grating target may be obtained by dividing an image of the grating target into two portions, optically modifying one such that a final image formed from the combination of the two portions is characterized by a Moiré pattern. Two or more such final images may be analyzed to determine a shift in the grating target position from differences in the Moiré patterns in the two or more final images. By appropriate optical manipulation, the pitch of the Moiré pattern may be made much larger than the pitch of the grating target. As a result, positional shifts smaller than the grating pitch may be readily determined using standard imaging systems.

Figure 1:
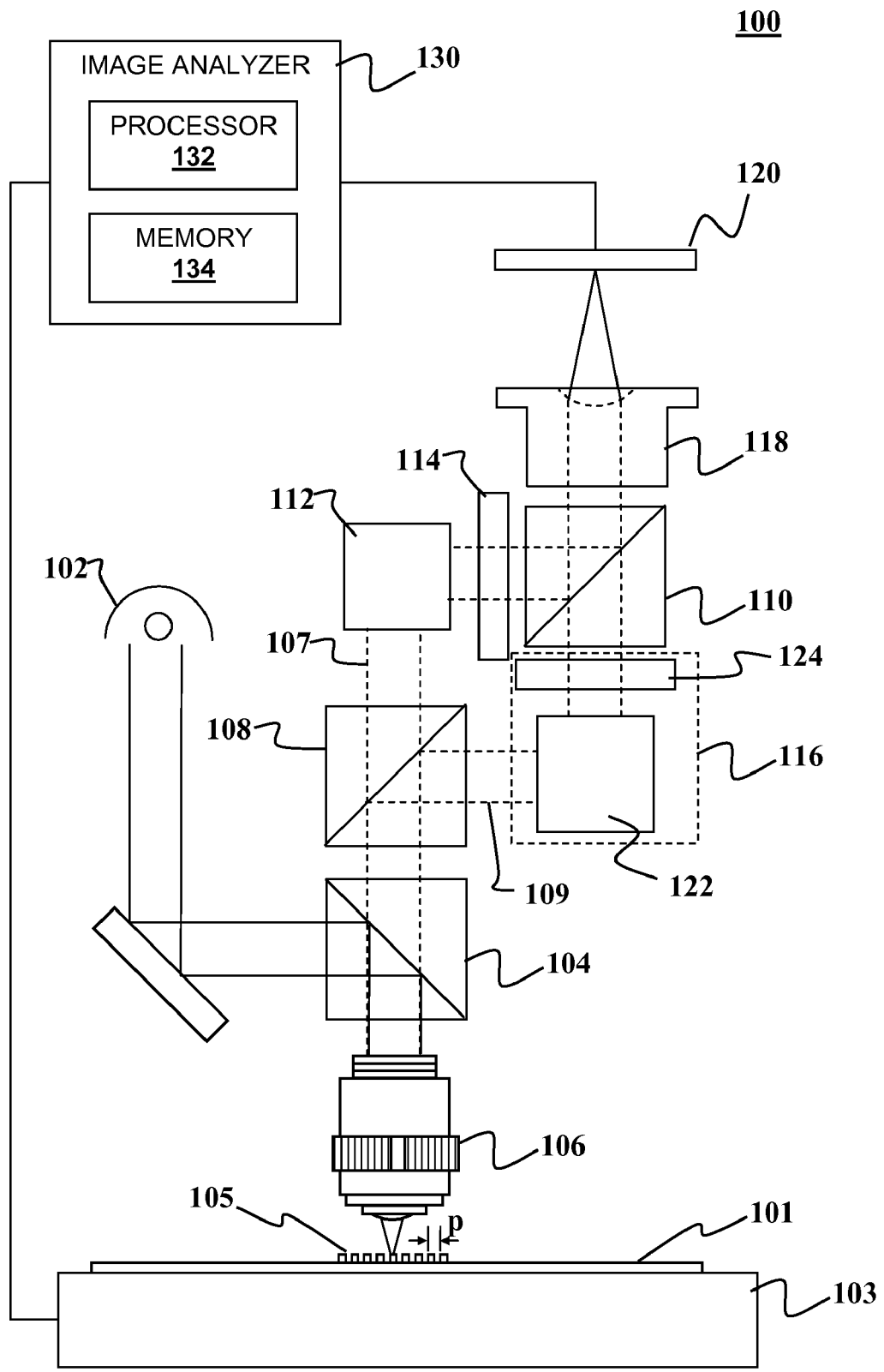
FIG. 1 is a schematic diagram of an optical system according to an embodiment of the present invention.

FIG. 1 depicts an optical alignment apparatus 100 according to an embodiment of the present invention. In the apparatus 100 a target substrate 101 rests on a substrate support 103, which may include a chuck to retain the substrate 101. In addition, the support 103 may include mechanisms for translating the substrate and/or rotating the substrate about one or more axes. The substrate includes a grating type target 105 characterized by a grating pitch p. Preferably, the grating target is of a type that produces a diffraction pattern having well defined diffraction orders. The grating target 105 may be illuminated with light from a source 102 delivered via an illumination beam splitter 104 and an objective lens 106.

Light scattered from the target 105 is collected by the objective lens 106 and collimated to form a parallel beam that passes through the illumination beam splitter 104 and is optically coupled to a first beam splitter 108, which splits the collimated light from the objective into two portions. This has the effect of dividing the image of the grating target 105 into a first portion 107 and a second portion 109. The first portion 107 may be optically coupled to a second beam splitter 110, e.g., by a mirror 112 and glass plate 114, without further optical manipulation that would alter an image formed by the light from the first portion 107. The second portion 109 passes through an image transformation element 116 optically coupled between the first beam splitter 108 and the second beam splitter 110. The second beam splitter combines the first portion 107 and the second portion 109. An imaging lens 118 may then focus the combined light of both portions to form a final image on an optical sensor 120, e.g., a charge-coupled device (CCD) array.

The image transformation element 116 is configured to optically modify the second portion 109 such that the final image formed from the combination of the first portion 107 and second portion 109 is characterized by a Moiré pattern. FIGS. 2A-2B and 3A-3B illustrate examples of possible transformations that may be implemented by the image transformation element 116.

Figure 3A:
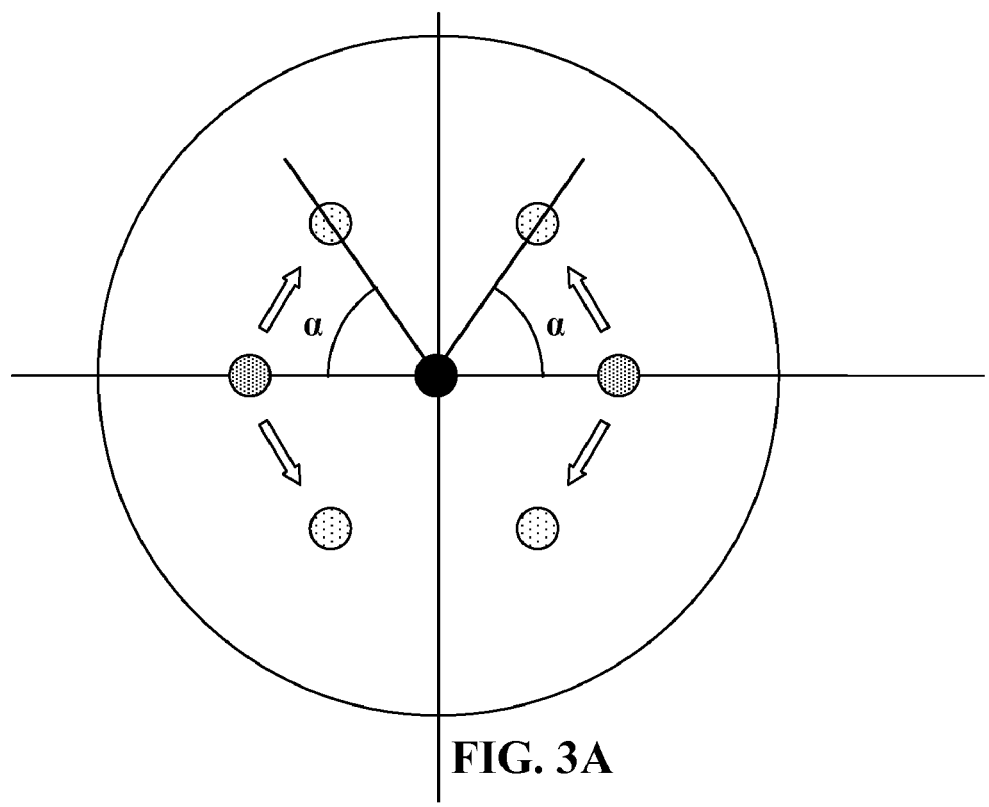
FIG. 3A is a pupil plane diagram illustrating splitting and rotation of an image of a grating according to an embodiment of the present invention.

As shown in FIG. 3A, one approach is to invert and scale one of the two images produced from the first and second portions 107, 109 by a magnification factor M, having a value sufficiently close to one. By way of example, a value of M is within about ±10% of one may be regarded as being sufficiently close. After cleaning out the high-frequency signal modulation which doesn't contain any information on the position of the grating target 105, one is left with a slowly varying envelope from which the grating position can be determined. The gain in this case is proportional to 1/(1−M).

Figure 4:
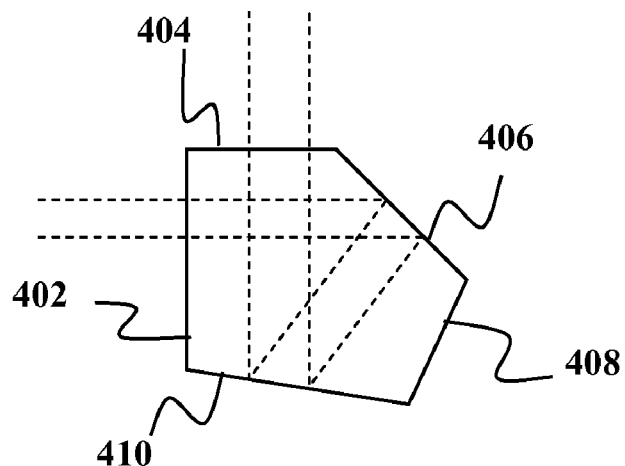
FIG. 4 is a schematic diagram of an optical element that may be used for inversion of an image in conjunction with an embodiment of the present invention.

According to one embodiment, the image transformation element 116 may be configured to magnify the portion of the final image formed by the second portion 109 relative to the portion of the final image formed by the first portion. By way of example, the image transformation element 116 may include a penta prism 122 and a magnifying lens 124. FIG. 4 shows an example of a penta prism. The penta prism 400 has two perpendicular faces 402, 404 and three non-perpendicular faces 406, 408, 410. Light enters through perpendicular face 402 reflects from non-perpendicular faces 406, 410 and exits through perpendicular face 404. The combination of two reflections undoes the inversion that would otherwise result from a single reflection.

Figure 2A:
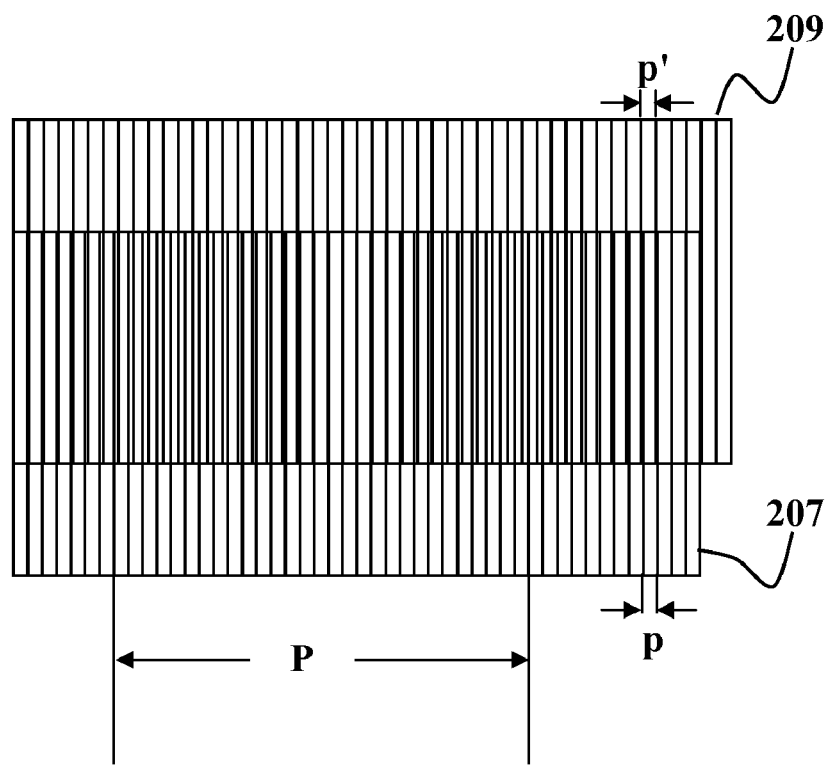
FIG. 2A is a schematic diagram illustrating generation of a Moiré pattern by interference of two grating images having slightly different pitch according to an embodiment of the present invention.

Due to the splitting of the light from the target 105, the imaging lens 118 produces two images of the grating that are superimposed over one another such that light from the two images interferes. As shown in FIG. 2A, light from the first portion 107 forms a first image 207 of the grating target 105 and light from the second portion 109 forms a second image 209. The first image 207 may be characterized by the grating pitch p. Due to magnification by the image transformation element 116, the image formed from the second portion 109 has a different pitch p'. As a result of the different pitches, the final image includes a Moiré pattern characterized by a pitch P. If the pitch p' in the second image 209 is only slightly different from the pitch p in the first image 207 there may be significant optical gain, i.e., the Moiré pattern pitch P may be significantly larger than the grating pitch p by a gain factor.

The gain factor may be determined by measuring pitch P in the Moiré pattern and the pitch p of the original grating and calculating the ratio of P/p. It is noted that if the original grating target 105 moves, the Moiré pattern shifts. The Moiré pattern shift can be directly related to the amount and direction of displacement of the grating. Therefore, by comparing two different Moiré patterns taken of the same grating one may measure the shift in the pattern and divide by the gain factor to obtain the shift in the grating to obtain the error in grating placement between the two images. An advantage of this technique is that only those errors generated after formation of the Moiré pattern are reduced by the gain factor. Consequently, grating placement errors (which are generated before the Moiré pattern) are not artificially diminished.

Figure 3B:
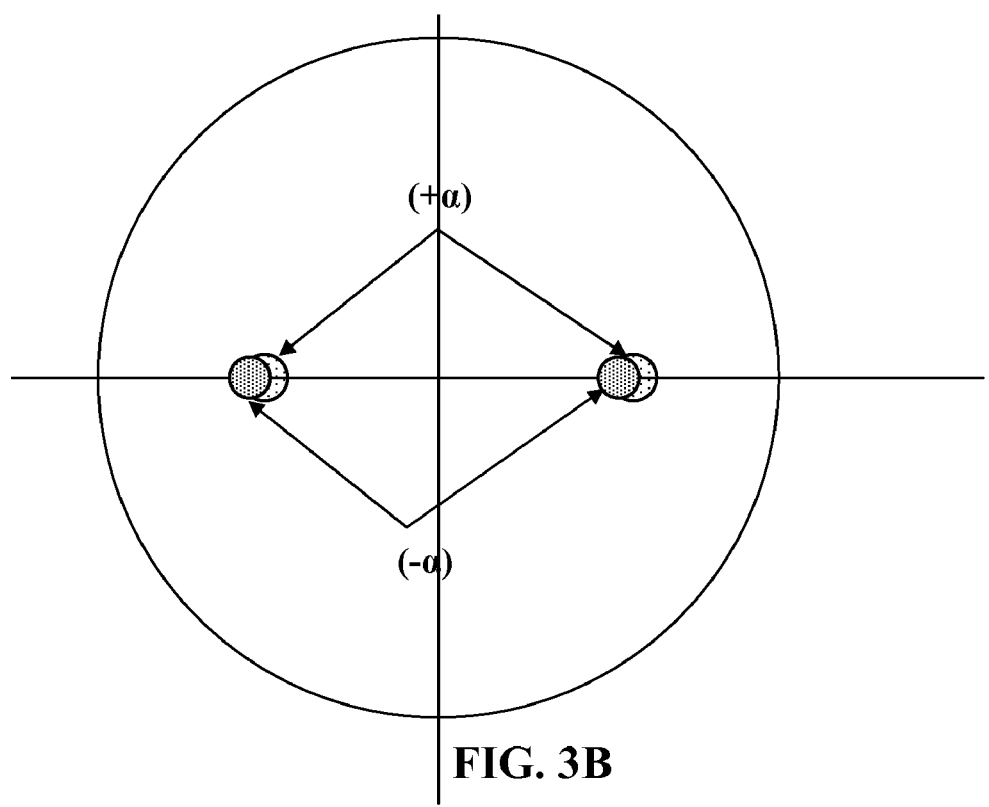
FIG. 3B is a pupil plane diagram illustrating splitting of an image into two parts and inverting and magnifying one part relative to the other according to an embodiment of the present invention.

According to an alternative embodiment, the image transformation element 116 may have the effect of rotating the image formed from the second portion 109 relative to the image formed from the first portion 107 (or vice versa). FIG. 3B shows the light distribution in a plane conjugate to an exit pupil of the apparatus 100 shown in FIG. 1. In the example shown in FIG. 3B, one of the waves is rotated by an angle α and another by an angle −α. In this case, when α is close to 90° a periodic signal is obtained.

Figure 2B:
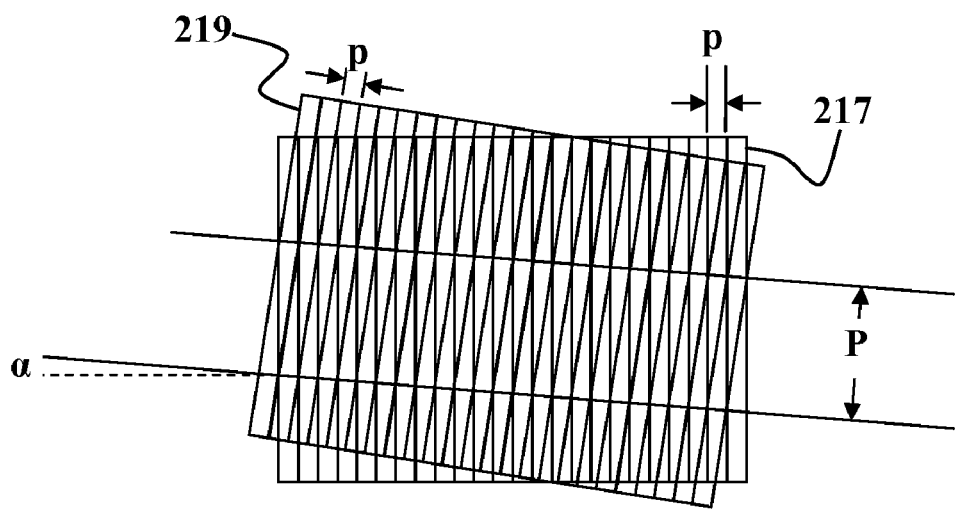
FIG. 2B is a schematic diagram illustrating a Moiré pattern generated by interference of two grating images that are rotated with respect to each other according to an embodiment of the present invention.

As shown in FIG. 2B, the light from the first portion 107 forms a first image 217 and the light from the second portion forms a second image 219, which is rotated relative to the first image by an angle α. The interference between the two images produces a Moiré pattern that produces a periodic signal. The periodic signal has a period that is close to the grating pitch p in the y direction and a period of p/cos(α)>>p in the x direction. According to this, any error in the detection of the signal position, excluding lens aberrations contributions, is reduced by a factor of cos(α)<<1. The corresponding gain factor is 1/cos(α). The dependence of the intensity of the signal s on the y coordinate may be expressed as $$s(y) = \frac{1}{2}\left((1 + \cos\left[\frac{4\pi}{p} y \sin(\alpha)\right]\right),$$

which may be transformed into a constant without contrast loss using, e.g., a Hilbert transform technique, where Hs(y), which is the Hilbert transform of s(y), is defined, e.g., as $$Hs(y) = \frac{1}{\pi} \int_{-\infty}^{\infty} \frac{s(x)}{x - y} dx.$$

Figure 5:
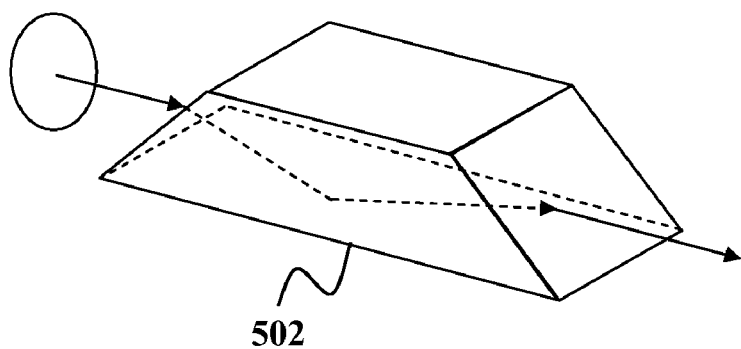
FIG. 5 is a schematic diagram of an optical element that may be used for rotation of an image in conjunction with an embodiment of the present invention.

By way of example, the image transformation element 116 may include a dove prism to implement the rotation of the second portion 109 relative to the first portion. FIG. 5 illustrates an example of a Dove prism 500. As used herein, a Dove prism refers to a form of prism invented by H. W. Dove that may be used to rotate parallel light. By way of example, the Dove prism 500 may resemble half of a common right-angle prism in which a ray entering parallel to the hypotenuse face 502 is reflected internally at that face and emerges parallel to its incident direction. One of the incident rays emerges along a continuation of its incident direction. If the Dove prism 500 is rotated about that ray through some angle the image rotates through twice that angle.

In embodiments of the present invention, an image analyzer 130 may be coupled to the optical sensor 120. The image analyzer 130 may include a processor 132 and memory 134. The memory 134 may contain one or more final images generated from signals from the sensor 120. The processor 132 may be adapted (e.g., by suitable program code instructions) to compare a Moiré pattern from an image signal obtained from the sensor 120 with a Moiré from an image stored in the memory 134 or to compare two or more images stored in the memory 134 to determine a shift in the position of the grating target 105 between the images. The processor 132 may generate signals based on the shift in position that direct the support 103 to compensate for the shift in the grating target position determined from the differences in the Moiré patterns in the two or more final image Embodiments of the present invention allow significant reduction of some error contributions to overlay metrology and alignment such as stage vibrations and drifts, CCD-induced shifts etc. by creating an optical gain. In this way, the error in signal position detection is divided by the gain and can be reduced by an order of magnitude.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An optical alignment apparatus, comprising:
   a first beam splitter adapted to divide an image of a grating target on a substrate into first and second portions;
   an image transformation element optically coupled to the first beam splitter; and
   a second beam splitter adapted to combine the first portion from the first beam splitter and the second portion from the image transformation element,
   wherein the image transformation element is configured to optically modify the first and/or second portion of the image of the grating target such that a final image formed from the combination of the first and second portions is characterized by a Moiré pattern and wherein the image transformation element is configured to magnify the second portion, such that the second portion of the grating image is characterized by a grating pitch that is different from a grating pitch of the first portion of the image.

2. The apparatus of claim 1 wherein the image transformation element includes a penta prism optically coupled to a magnifying lens.

3. The apparatus of claim 1, further comprising an objective lens optically coupled to the first beam splitter and adapted to receive light from the grating target and transmit a collimated beam of light to the first beam splitter.

4. The apparatus of claim 1 wherein the image transformation element is configured to rotate the second portion of the image of the grating target relative to the first portion.

5. The apparatus of claim 1, further comprising a focusing lens optically coupled to the second beam splitter and adapted to form the final image from the combination of the first and second portions.

6. The apparatus of claim 4 wherein the image transformation element includes a Dove prism.

7. The apparatus of claim 5, further comprising an optical sensor configured to sense light from the final image.

8. The apparatus of claim 7, further comprising an image analyzer coupled to the optical sensor, the image analyzer having a memory containing one or more final images and a processor, the processor being adapted to compare a Moiré pattern from an image signal obtained from the sensor with a Moiré from an image stored in the memory or to compare two or more images stored in the memory to determine a shift in the position of the grating target between the images.

9. A method for optically aligning a substrate with a grating target, comprising:
   a) obtaining a resultant image of the grating target by:
      i) dividing an image of the grating target into first and second portions;
      ii) optically modifying the first and/or second portion such that a final image formed from the combination of the first and second portions is characterized by a Moiré pattern, which comprises magnifying the second portion relative to the first portion such that the second portion of the image of the grating target is characterized by a different pitch than the first portion of the image of the grating target, whereby the Moiré pattern is produced when the first and second portions are combined to form the resultant image;
      iii) combining the first and second portions to form the final image; and
   b) analyzing the resultant image to determine a shift in the grating target from a shift in the Moiré pattern.

10. The method of claim 9 wherein optically modifying the second portion includes rotating the second portion relative to the first portion such that the Moiré pattern is produced when the first and second portions are combined to form the resultant image.

11. The method of claim 9, further comprising compensating for the shift in the grating target determined from the shift in the Moiré pattern.

* * * * *